US012633457B2

(12) United States Patent
Song et al.

(10) Patent No.: US 12,633,457 B2
(45) Date of Patent: May 19, 2026

(54) CAPACITOR, SEMICONDUCTOR DEVICE INCLUDING THE CAPACITOR, AND ELECTRONIC APPARATUS INCLUDING THE SEMICONDUCTOR DEVICE

(71) Applicant: Samsung Electronics Co., Ltd., Suwon-si (KR)

(72) Inventors: Jeonggyu Song, Suwon-si (KR); Eunae Cho, Suwon-si (KR); Narae Han, Suwon-si (KR); Beomseok Kim, Suwon-si (KR); Cheheung Kim, Suwon-si (KR); Jooho Lee, Suwon-si (KR); Wonsik Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 18/350,600

(22) Filed: Jul. 11, 2023

(65) Prior Publication Data

US 2024/0170212 A1     May 23, 2024

(30) Foreign Application Priority Data

Nov. 21, 2022     (KR) ........................ 10-2022-0156690

(51) Int. Cl.
        *H10D 1/66*          (2025.01)
        *H01G 4/10*          (2006.01)
                (Continued)

(52) U.S. Cl.
        CPC .............. *H01G 4/10* (2013.01); *H10B 12/31* (2023.02); *H10D 1/66* (2025.01); *H10D 1/692* (2025.01);
                (Continued)

(58) Field of Classification Search
        None
        See application file for complete search history.

(56) References Cited

U.S. PATENT DOCUMENTS 3,819,990 A      6/1974   Hayashi et al.
5,614,018 A      3/1997   Azuma et al.
                (Continued)

FOREIGN PATENT DOCUMENTS

JP        2012-248716 A      12/2012
KR    10-2021-0026529 A       3/2021
                (Continued)

OTHER PUBLICATIONS

European Office Action dated Sep. 30, 2024 issued in European Patent Application No. 23 189 273.8-1211.
                (Continued)

*Primary Examiner* — Xiaoming Liu
(74) *Attorney, Agent, or Firm* — Harness, Dickey & Pierce, P.L.C.

(57)                ABSTRACT

A capacitor, a semiconductor device, and an electronic apparatus including the semiconductor device are disclosed. The capacitor includes a first electrode; a second electrode disposed apart from the first electrode; a dielectric film between the first electrode and the second electrode; and a leakage current reducing layer provided on the dielectric film between the first electrode and the second electrode and including $M_xAl_yO_z$.

17 Claims, 7 Drawing Sheets

(51) Int. Cl.

| | |
|---|---|
| H10B 12/00 | (2023.01) |
| H10D 1/68 | (2025.01) |
| H10D 64/68 | (2025.01) |
| *H01G 4/008* | (2006.01) |
| *H01G 4/12* | (2006.01) |

(52) U.S. Cl.
CPC .......... H10D 1/694 (2025.01); H10D 64/681 (2025.01); H10D 64/691 (2025.01); *H01G 4/008* (2013.01); *H01G 4/1209* (2013.01); *H01G 4/1236* (2013.01)

(56) References Cited

U.S. PATENT DOCUMENTS

| | | | |
|---|---|---|---|
| 6,750,502 B1 | 6/2004 | Sandhu et al. | |
| 9,281,123 B2 | 3/2016 | Takeoka et al. | |
| 2006/0102983 A1* | 5/2006 | Iijima | H10D 1/68 257/532 |
| 2011/0037131 A1* | 2/2011 | Mueller | H01L 21/28176 257/E21.409 |
| 2013/0113079 A1 | 5/2013 | Malhotra et al. | |
| 2014/0187018 A1* | 7/2014 | Malhotra | H10D 1/684 438/396 |
| 2015/0060991 A1* | 3/2015 | Mizutani | H01L 21/02318 438/287 |
| 2020/0161438 A1* | 5/2020 | Tang | H10D 64/685 |
| 2020/0312952 A1* | 10/2020 | Cho | H10D 1/692 |
| 2021/0265458 A1 | 8/2021 | Song et al. | |
| 2022/0130947 A1 | 4/2022 | Lee et al. | |
| 2022/0140067 A1 | 5/2022 | Song et al. | |
| 2022/0238641 A1 | 7/2022 | Park et al. | |

FOREIGN PATENT DOCUMENTS

| | | |
|---|---|---|
| KR | 10-2021-0108736 A | 9/2021 |
| KR | 10-2022-0106336 A | 7/2022 |

OTHER PUBLICATIONS

Shannon R D et al: "Dielectric constant of MgAl2O4 spinel and the oxide additivity rule", Journal of Physics and Chemistry of Solids, Pergamon Press, London, GB, vol. 52, No. 9, Jan. 1, 1991 (Jan. 1, 1991), pp. 1055-1059, XP024649055, ISSN: 0022-3697, DOI: 10.1016/0022-3697(91)90038-2.

Office Action issued Nov. 16, 2023 in Korean Application No. 10-2022-0156690.

Extended European Search Report issued Dec. 11, 2023 in European Application No. 23189273.8.

Xiang et al., "Electronic and optical properties of the spinel oxides MgxZn1-xAl2O4 by first-principles calculations", Materiali in Technologije—Materials and Technology, vol. 51, No. 5, pp. 735-743, Oct. 16, 2017.

* cited by examiner

CAPACITOR, SEMICONDUCTOR DEVICE INCLUDING THE CAPACITOR, AND ELECTRONIC APPARATUS INCLUDING THE SEMICONDUCTOR DEVICE

CROSS-REFERENCE TO RELATED APPLICATION

This application is based on and claims priority under 35 U.S.C. § 119 to Korean Patent Application No. 10-2022-0156690, filed on Nov. 21, 2022, in the Korean Intellectual Property Office, the disclosure of which is incorporated by reference herein in its entirety.

BACKGROUND

1. Field

The disclosure relates to a capacitor, a semiconductor device including the same, and an electronic apparatus including the semiconductor device.

2. Description of the Related Art

As electronic apparatuses are down-scaled, the space available for semiconductor devices in the electronic apparatuses is also reduced. Accordingly, a decrease in the size of components comprising the electronic apparatuses (such as capacitors) and a thickness of a dielectric layer of the capacitor are required. However, in some cases, a large leakage current may occur through the dielectric layer of the capacitor.

SUMMARY

Provided is a capacitor with a reduced leakage current, a semiconductor device and an electronic apparatus including the capacitor.

Additional aspects will be set forth in part in the description which follows and, in part, will be apparent from the description, or may be learned by practice of the presented embodiments of the disclosure.

According to an aspect of the disclosure, a capacitor includes a first electrode, a second electrode spaced apart from the first electrode, a dielectric film between the first electrode and the second electrode, and a leakage current reducing layer between the dielectric film and at least one of the first electrode or the second electrode, wherein the leakage current reducing layer includes an M-including oxide ($M_xAl_yO_z$), wherein x+y+z=1, 0<x<0.3, 0.16<y<0.4, 0.54<z<0.6, and wherein the M-including oxide has a greater energy band gap than $Al_2O_3$.

M may include Mg or Si.

The leakage current reducing layer may have a thickness of about 30 Å or less.

A total thickness of the dielectric film and the leakage current reducing layer may have a range of about 80 Å or less.

The dielectric film may include at least one of $ZrO_2$, $HfO_2$, $Al_2O_3$, SrO, or BaO.

At least one of the first electrode or the second electrode may include TiN doped with at least one of V, Nb, Ta, Cr, Mo, W, Pt, Ru, or Ir.

At least one of the first electrode or the second electrode each may include at least one selected from the group consisting of W, TaN, TiN, RuOx, TiN, NbN, Sc, Al, Mo, MoN, Pd, Pt, Sn, La, or Ru.

One of the first and second electrodes may include a semiconductor material.

According to another aspect of the disclosure, a semiconductor device includes a substrate; a gate structure on the substrate; a first source/drain region and a second source/drain region on the substrate; and a capacitor electrically connected to one of the first or second source/drain regions, wherein the capacitor includes a first electrode, a second electrode spaced apart from the first electrode, a dielectric film between the first electrode and the second electrode, and a leakage current reducing layer between the dielectric film and least one of the first electrode or the second electrode, wherein the leakage current reducing layer includes an M-including oxide ($M_xAl_yO_z$), wherein x+y+z=1, 0<x<0.3, 0.16<y<0.4, 0.54<z<0.6, and wherein the M-including oxide has a greater energy band gap than $Al_2O_3$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
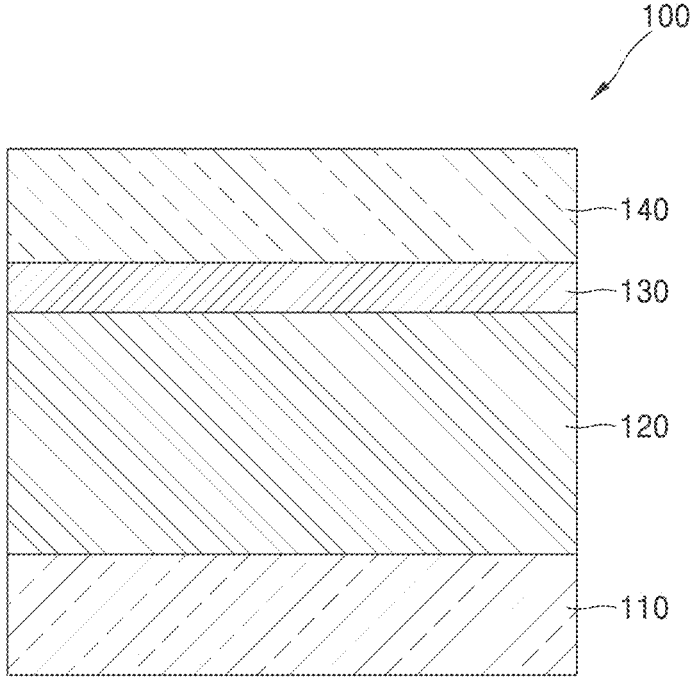
FIG. 1 is a cross-sectional view of a capacitor according to at least one embodiment.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a capacitor according to various embodiments, a semiconductor device, and an electronic apparatus including the same will be described in detail with reference to the accompanying drawings. In the drawings, sizes of elements in the drawings may be exaggerated for clarity and convenience of explanation. Although the terms "first," "second," etc., may be used herein to describe various elements, these elements should not be limited by these terms. These terms are only used to distinguish one element from another.

The singular forms include the plural forms unless the context clearly indicates otherwise. Also, when a part "comprises" or "includes" an element in the specification, unless otherwise defined, it is not excluding other elements but may further include other elements. In addition, in the drawings, sizes of elements in the drawings may be exaggerated for clarity and convenience of explanation. Also, when it is described that a predetermined material layer is present on a substrate or another layer, the material layer may exist in direct contact with the substrate or other layer, and another third layer may exist therebetween. In addition, since the materials constituting each layer in the following embodiments are examples, other materials may be used.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

Also, in the specification, functional elements and the term "units" denote units that process at least one function or operation, and may be realized by processing circuitry such as hardware, software, or a combination of hardware and software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components. The processing circuitry may include electrical components such as logic gates including at least one of AND gates, OR gates, NAND gates, NOT gates, etc., and/or electronic circuits including said components.

Some specific executions described in the current embodiment are examples, and thus, do not limit in any way the technical scope of the disclosure. For the simplicity of the specification, descriptions of electronic configurations of the related art, control systems, software, and other functional aspects may be omitted. In addition, connections or connection members of lines between components shown in the drawings illustrate functional connections and/or physical or circuit connections, and the connections or connection members may be represented by replaceable or additional various functional connections, physical connections, or circuit connections in an actual apparatus.

The term "above" and similar directional terms may be applied to both singular and plural. In addition, it will be understood that these, and other similar, directional terms are intended to encompass different orientations in addition to the orientation depicted in the figures. For example, if the device in the figures is otherwise oriented (e.g., rotated 90 degrees or at other orientations), the directional descriptors used herein are to be interpreted accordingly.

Also, the operations of all methods described herein may be performed in any suitable order unless otherwise indicated herein or otherwise clearly contradicted by context. In addition, the use of any and all examples, or exemplary language (e.g., "such as") provided herein, is intended merely to better illuminate the disclosure and does not pose a limitation on the scope of the disclosure unless otherwise claimed.

FIG. 1 is a cross-sectional view of a capacitor 100 according to at least one embodiment.

The capacitor 100 may include a first electrode 110, a second electrode 140 spaced apart from the first electrode 110, a dielectric film 120 disposed between the first electrode 110 and the second electrode 140, and a leakage current reducing layer 130 disposed on the dielectric film 120 between the first electrode 110 and the second electrode 140. For example, the leakage current reducing layer 130 may be disposed between the dielectric film 120 and the second electrode 140.

The second electrode 140 may be spaced apart from and face the first electrode 110. The first electrode 110 and the second electrode 140 may each independently include a conductive material such as a metal, a metal nitride, a metal oxide, a combination thereof, and/or the like. For example, the first electrode 110 and the second electrode 140 may each independently include a metal (such as ruthenium (Ru), titanium (Ti), tantalum (Ta), niobium (Nb), iridium (Ir), or molybdenum (Mo), tungsten (W), and platinum (Pt), etc.), a conductive metal nitride (such as titanium nitride (TiN), tantalum nitride (TaN), niobium nitride (NbN), molybdenum nitride (MoN), cobalt nitride (CoN), tungsten nitride (WN), etc.), and/or a conductive metal oxide (such as platinum oxide (PtO), iridium oxide ($rO_2$), ruthenium oxide ($RuO_2$), strontium ruthenium oxide ($SrRuO_3$), barium strontium ruthenium oxide (($Ba,Sr)RuO_3$), calcium ruthenium oxide ($CaRuO_3$), lanthanum strontium cobalt oxide (($La,Sr)CoO_3$), etc.).

According to at least some embodiments, the first electrode 110 and the second electrode 140 may each independently include a metal nitride represented by M"MN. Here, M" is a metal element, M' is an element different from M", and N is nitrogen. For example, the metal nitride may include a metal nitride (M"N) doped with element M'.

M" may be, for example, one or two (or more) elements selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

M' may be, for example, one or two (or more) elements selected from H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

The first electrode 110 and the second electrode 140 may independently include a single material layer or have a structure in which a plurality of material layers are stacked. For example, according to at least one embodiment, the first electrode 110 and/or the second electrode 140 may be a single layer of titanium nitride (TiN) or a single layer of niobium nitride (NbN). Alternatively, according to at least one embodiment, the first electrode 110 and/or the second electrode 140 may have a structure in which a first electrode layer including titanium nitride (TiN) and a second electrode layer including niobium nitride (NbN) are stacked.

Alternatively, the first electrode 110 and the second electrode 140 each may include at least one selected from the group consisting of W, TaN, TiN, RuOx, TiN, NbN, Sc, Al, Mo, MON, Pd, Pt, Sn, La, and Ru.

Alternatively, one of the first electrode 110 and the second electrode 140 may include a semiconductor material. Alternatively, the second electrode 140 may include TiN doped with at least one of V, Nb, Ta, Cr, Mo, W, Pt, Ru, and Ir.

The dielectric film 120 may be provided on the first electrode 110. The dielectric film 120 may be disposed to directly contact the first electrode 110. The dielectric film 120 may include a dielectric material having paraelectric characteristics. In at least one embodiment, the dielectric film 120 may include a dielectric material having a dielectric constant in a range from about 20 to about 70.

The dielectric film 120 may include a metal oxide represented by $M_xO_y$ (x and y are natural numbers). Here, M represents one metal element selected from the group consisting of Ca, Sr, Ba, Al, Sc, Y, La, Ti, Zr, Hf, Nb, Ta, Ce, Pr, Nd, Gd, Dy, Yb, and Lu.

The dielectric film 120 may include a material selected for a desired capacitance. The dielectric film 120 may include a material with a high dielectric constant. As the degree of integration of an integrated circuit device provided with the capacitor 100 increases, a space occupied by the capacitor 100 gradually decreases, and therefore, a dielectric having a high dielectric constant, such as the dielectric film 120, may be used. The high dielectric constant may denote a dielectric constant greater than that of silicon oxide. For example, the dielectric film 120 may include at least one of $ZrO_2$, $HfO_2$, $Al_2O_3$, SrO, and BaO. As shown, the dielectric film 120 may have a single-layer structure, but is not limited thereto and may have a multi-layer structure. The dielectric film 120 may have a thickness selected to implement a desired capacitance.

The leakage current reducing layer 130 may serve to reduce leakage current flowing inside the capacitor 100. To this end, the leakage current reducing layer 130 may include $M_xAl_yO_z$ (x+y+z=1). For example, $M_xAl_yO_z$ may be 0<x<0.3, 0.16<y<0.4, or 0.54<z<0.6 and M may be a different metal from Al. Meanwhile, the M-including oxide may be (and/or include) a material having a greater energy bandgap than $Al_2O_3$. The energy bandgap of $Al_2O_3$ is approximately 6.8 Ev. When the M-including oxide is or includes a material having an energy band gap greater than 6.8 eV, a conduction band offset between the second electrode 140 and the dielectric film 120 is increased and a valence band offset is reduced, and thus, a leakage current may be reduced. For example, according to at least one embodiment, M may include Mg or Si.

The leakage current reducing layer 130 may have a thickness of about 30 Å or less. The leakage current reducing layer 130 may have a thickness in a range of about 1 Å to about 30 Å. If the thickness of the leakage current reducing layer 130 is out of this range, the effect of reducing the leakage current and/or increasing the capacitance may be reduced. A total thickness of the dielectric film 120 and the leakage current reducing layer 130 may be approximately 80 Å or less. A total thickness of the dielectric film 120 and the leakage current reducing layer 130 may be in a range from about 40 Å to about 80 Å. However, the example embodiments are not limited thereto.

In the capacitor 100 according to at least one embodiment, because the leakage current reducing layer 130 is provided, a capacitance may be increased and/or a leakage current value may be decreased.

The capacitor 100, according to at least one embodiment, may be applied to a capacitor having a Metal-Insulator-Metal (MIM) structure in which both the first electrode 110 and the second electrode 140 include a conductive material with metallic conductance. Alternatively, the capacitor 100 may be applied to a Metal-Insulator-Semiconductor (MIS) structure in which one of the first electrode 110 and the second electrode 140 includes a conductive material and the other includes a semiconductor material.

Next, capacitance and leakage current of the capacitor 100, according to at least one embodiment and Comparative Examples will be compared and described. In the capacitor 100, the leakage current reducing layer 130 includes $Mg_{0.14}Al_{0.29}O_{0.57}$, in Comparative Example 1, the leakage current reducing layer includes $Al_2O_3$, and in Comparative Example 2, the leakage current reducing layer includes MgO.

Figure 2:
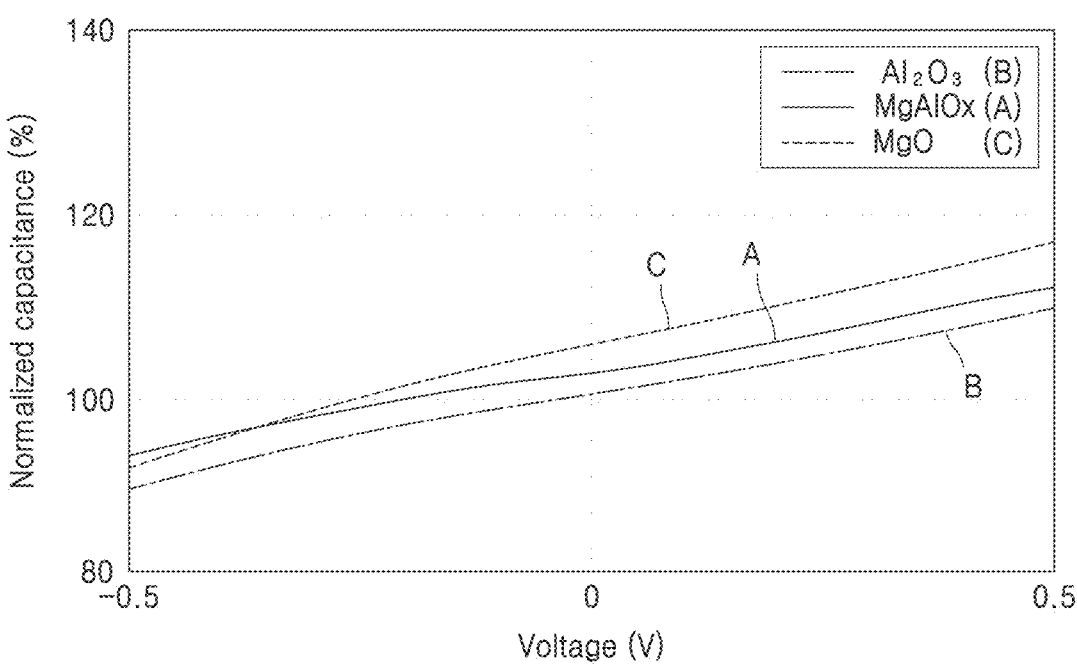
FIG. 2 is a graph showing a change in capacitance according to voltage for a capacitor according to at least one embodiment and Comparative Examples 1 and 2.

FIG. 2 is a graph showing normalized capacitance, according to voltage for the capacitor 100 and according to at least one embodiment and Comparative Examples 1 and 2. Graph A shows capacitance for the capacitor 100, graph B shows capacitance for Comparative Example 1, and graph C shows capacitance for Comparative Example 2. As shown in the graph, the capacitance represents a relationship of C>A>B.

Figure 3:
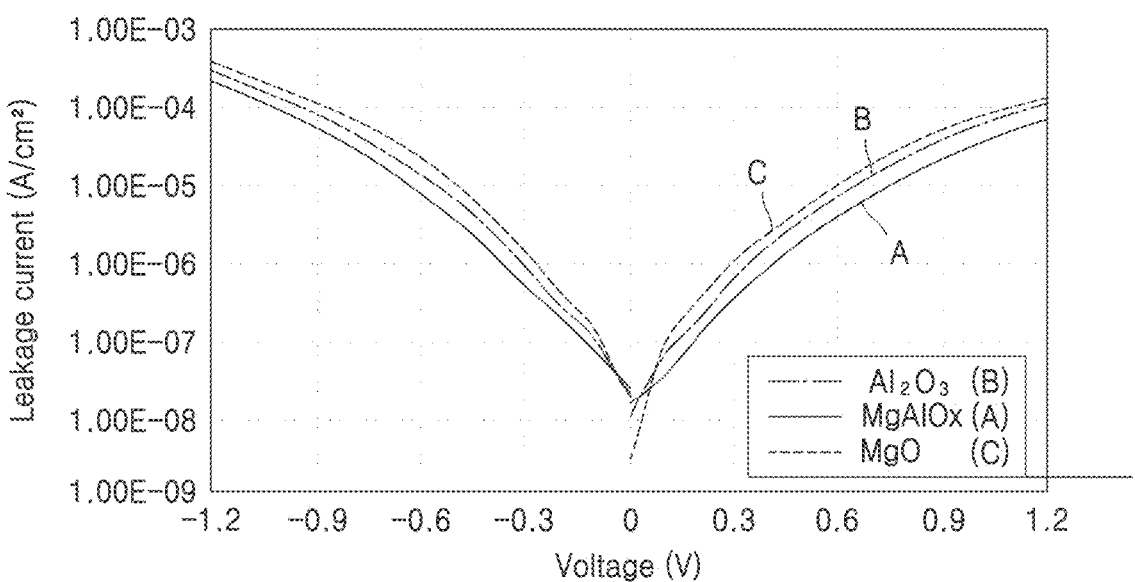
FIG. 3 is a graph showing a change in leakage current according to voltage for a capacitor according to at least one embodiment and Comparative Examples 1 and 2.

FIG. 3 is a graph showing a change in leakage current according to voltage for the capacitor 100 and Comparative Examples 1 and 2. As shown in the graph, the leakage current represents a relationship of A<B<C.

Figure 4:
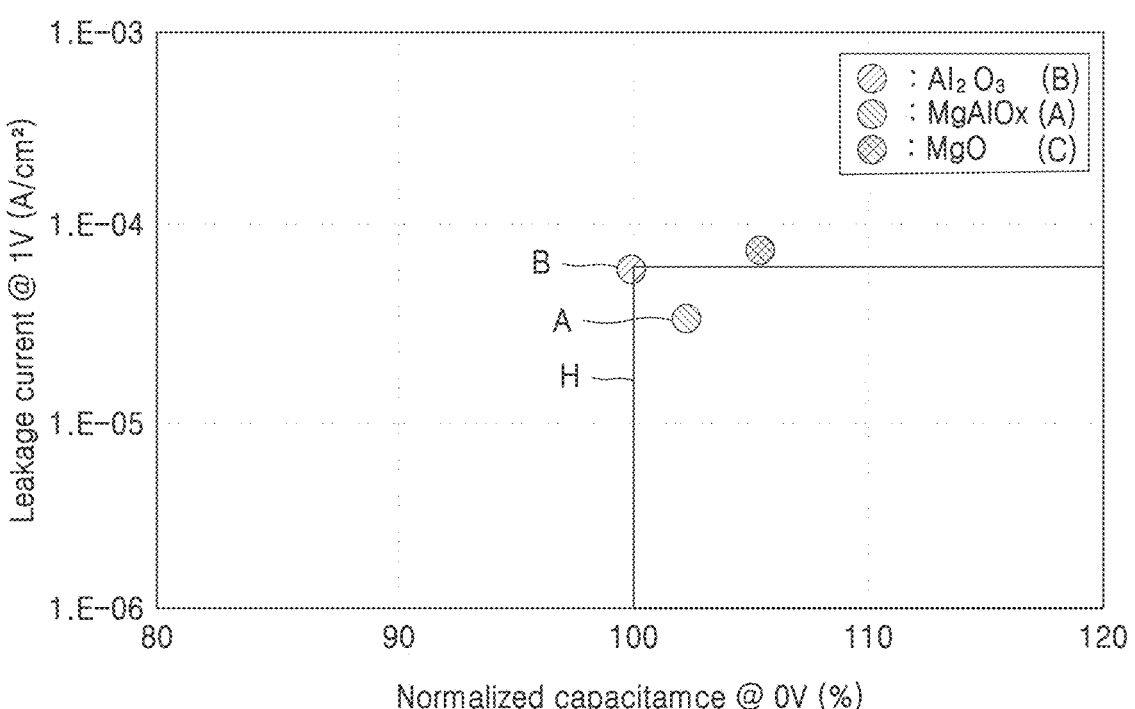
FIG. 4 is a graph showing values of normalized capacitance and leakage current at 0 volt for a capacitor according to at least one embodiment and Comparative Examples 1 and 2.

FIG. 4 shows normalized capacitance and leakage current at 0 volt for the capacitor 100 and Comparative Examples 1 and 2. In FIG. 4, a box H may indicate a range of coordinate values of capacitance and leakage current required for a capacitor with good performance. In FIG. 4, when the coordinate values of the capacitance and the leakage current are within the box H, it is shown that the leakage current is reduced and simultaneously the capacitance is increased. In the case of the capacitor 100, coordinate values of capacitance and leakage current are located within the box H, whereas coordinate values (B) of Comparative Example 1 and coordinate values (C) of Comparative Example 2 are located outside the box H. As such, the capacitor 100, according to at least one embodiment may increase capacitance as well as reduce leakage current. Accordingly, electrical characteristics of the capacitor 100 may be improved through the leakage current reducing layer 130.

Figure 5:
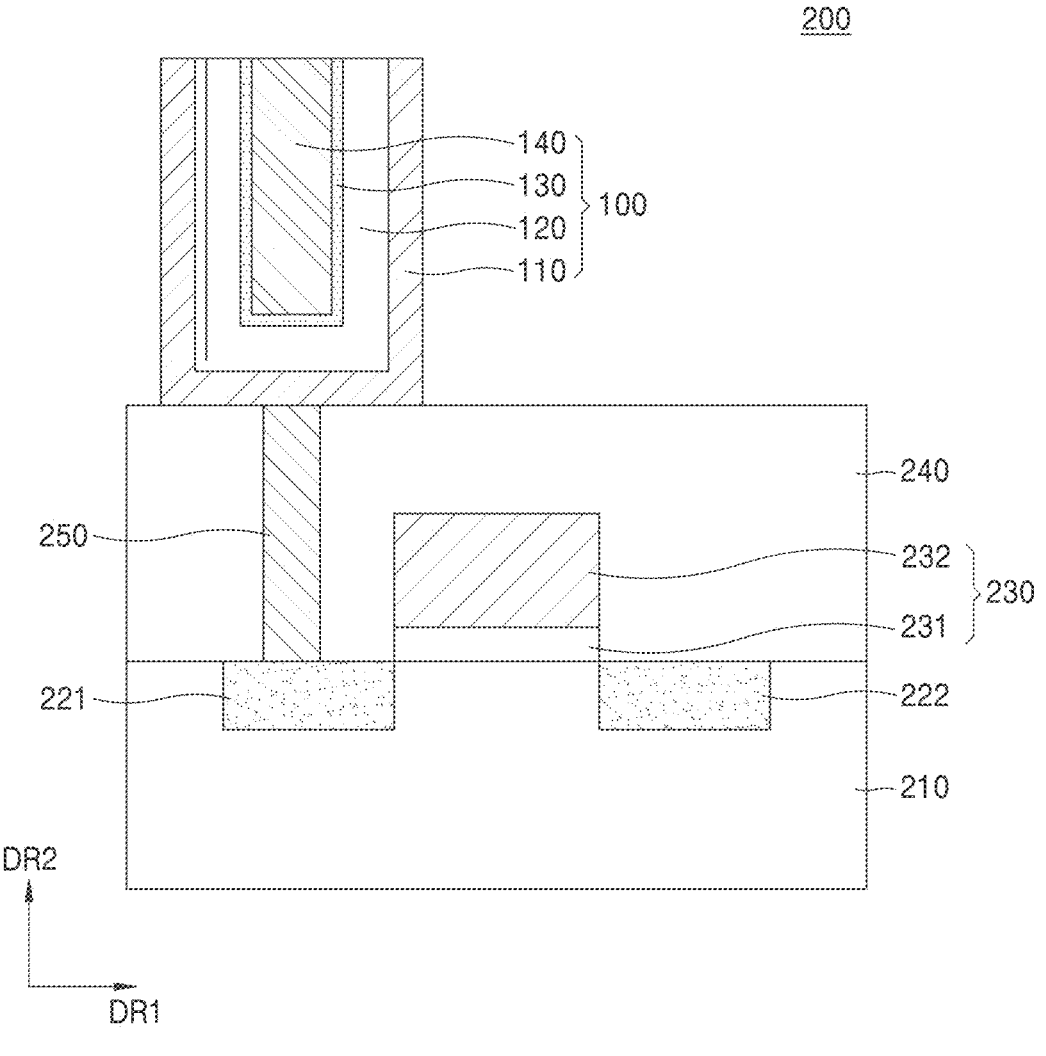
FIG. 5 is a diagram schematically illustrating a semiconductor device according to at least one embodiment.

FIG. 5 is a cross-sectional view of a semiconductor device 200, according to at least one embodiment. For brevity of description, substantially similar descriptions as those given with reference to FIG. 1 may be omitted.

Referring to FIG. 5, the semiconductor device 200 may include a substrate 210, a gate structure 230, an interlayer insulating layer 240, a contact 250, and a capacitor 100. The substrate 210 may include a semiconductor substrate. The substrate 210 may include, for example, a semiconductor material, such as silicon (Si), germanium (Ge), silicon germanium (SiGe), silicon carbide (SiC), gallium arsenide (GaAs), indium arsenic (InAs), indium phosphide (InP), etc., and/or an insulating material, such as silicon oxide, silicon nitride, silicon oxynitride, etc.

A first source/drain region 221 and a second source/drain region 222 may be provided on the substrate 210. The first and second source/drain regions 221 and 222 may be spaced apart from each other in a first direction DR1 parallel to a top surface of the substrate 210. According to at least one embodiment, the first and second source/drain regions 210 and 220 may be formed by implanting impurities into the substrate 210.

A gate structure 230 may be provided on the substrate 210. The gate structure 230 may be provided between the first and second source/drain regions 221 and 222 and may define a channel region therebetween. The gate structure 230 may include a gate electrode 232 and a gate insulating layer 231. The gate electrode 232 may include a conductive material. For example, the gate electrode 232 may include metal and/or polysilicon.

The gate insulating layer 231 may be disposed between the gate electrode 232 and the substrate 210. The gate insulating layer 231 may insulate the substrate 210 from the gate electrode 232. The gate insulating layer 231 may include a dielectric material. For example, the gate insulating layer 231 may include Si oxide (e.g., $SiO_2$), Al oxide (e.g., $Al_2O_3$), a high-k material (e.g., $HfO_2$), a combination thereof, and/or the like.

The interlayer insulating layer 240 may be provided on the substrate 210 to cover the gate structure 230. The interlayer insulating layer 240 may include an insulating material. For example, the interlayer insulating layer 240 may include Si oxide (e.g., $SiO_2$), Al oxide (e.g., $Al_2O_3$), a high-k material (e.g., $HfO_2$), a combination thereof, and/or the like.

The capacitor 100 may be provided on the interlayer insulating layer 240. The capacitor 100 may include a first electrode 110, a dielectric film 120, a leakage current reducing layer 130, and a second electrode 140. The first electrode 110, the dielectric film 120, the leakage current reducing layer 130, and the second electrode 140 may be substantially similar and/or the same as those described with reference to FIG. 1. According to at least some embodiments, the capacitor 100 may be provided as a pillar capacitor, but is not limited thereto, and may, for example, be provided as a planar capacitor (as illustrated in FIG. 1), and/or the like.

The contact 250 may be provided between the first electrode 110 (or the second electrode 140) and the first source/drain region 221 to electrically connect the capacitor 100 to the source/drain region 221. The contact 250 may pass through the interlayer insulating layer 240. The contact 250 may include a conductive material (e.g., a metal, a metallic conductor, and/or the like).

The leakage current reducing layer 130 reduces a leakage current of the capacitor 100 and increases the capacitance, and thus, the stability and reliability of the semiconductor device 200 may be improved. The capacitor 100 may be applied to semiconductor devices, such as DRAMs and electronic apparatuses, such as mobile devices, computers, notebooks, sensors, network devices, and neuromorphic devices.

Figure 6:
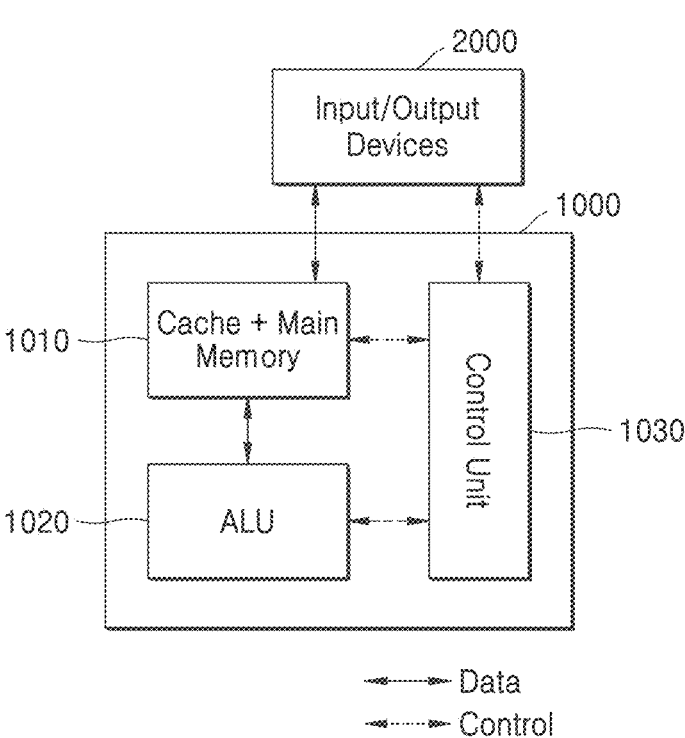
FIGS. 6 and 7 are conceptual block diagrams schematically illustrating example device architectures applicable to electronic apparatuses according to some embodiments.
Figure 7:
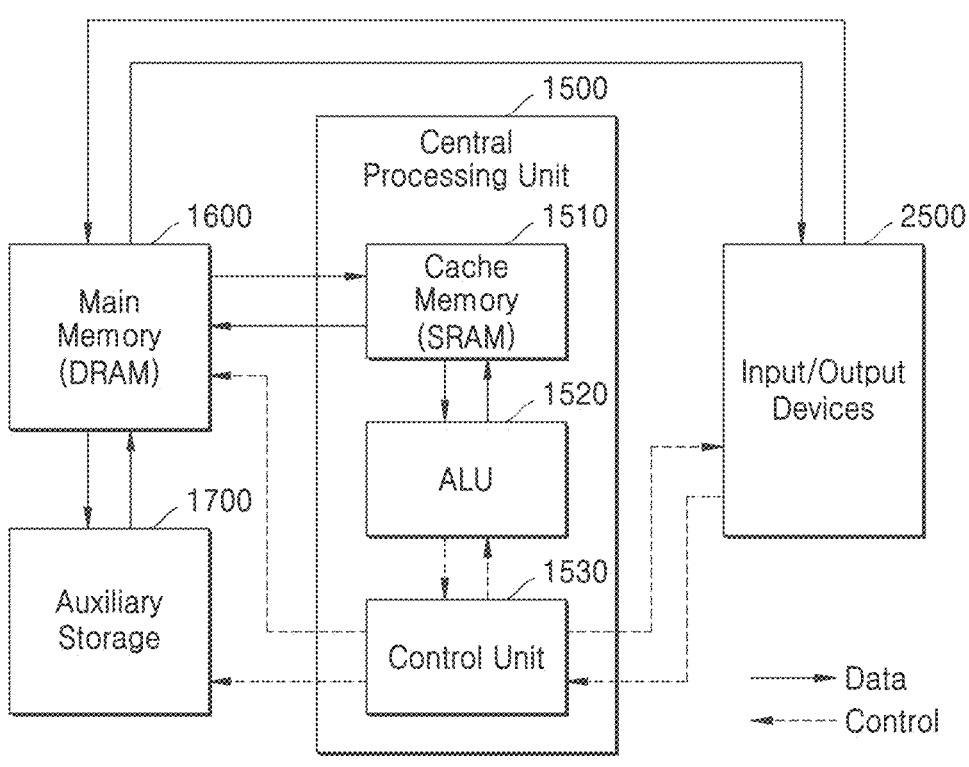

FIGS. 6 and 7 are conceptual diagrams schematically illustrating example device architectures applicable to electronic apparatuses according to some embodiments.

Referring to FIG. 6, the device architecture 1000 may include a memory unit 1010, an arithmetic logic unit (ALU) 1020, and a control unit 1030. The memory unit 1010, the ALU 1020, and the control unit 1030 may be electrically connected to each other. In at least one example embodiment, the device architecture 1000 may be implemented as a single chip including the memory unit 1010, the ALU 1020, and the control unit 1030. For example, the memory unit 1010, the ALU 1020, and the control unit 1030 may be connected to each other through a metal line on-chip and may communicate directly. The memory unit 1010, the ALU 1020, and the control unit 1030 may be monolithically integrated on one substrate to form one chip. Also, the memory unit 1010 may include both a main memory and a cache memory. This device architecture 1000 may be an on-chip memory processing unit. The memory unit 1010, the ALU 1020, and/or the control unit 1030 may each independently include the aforementioned capacitor, semiconductor device, and/or electronic apparatus. For example, in at least one embodiment, the memory unit 1010 may include a plurality of the semiconductor device arranged in an array and configured to store data using a plurality of the capacitor 100.

The input/output device 2000 may be connected to the device architecture 1000. The input/output device (and/or devices) 2000 may include, for example, an input device (such as a microphone, touch pad, electronic mouse, keyboard, keypad, camera, etc.) and/or an output device (such as a speaker, display, haptic system, etc.). According to at least some example embodiments, the input/output devices 2000 may be provided individually and/or in combination (e.g., a touch screen display). The device architecture 1000 may be configured to control and to receive data from the input/output devices 2000.

Referring to FIG. 7, a cache memory 1510, an ALU 1520, and a control unit 1530 may comprise a Central Processing Unit (CPU) 1500, and the cache memory 1510 may include a static random access memory (SRAM). Apart from the CPU 1500, a main memory 1600 and an auxiliary storage 1700 may be provided. In at least some embodiments, at least one of the main memory 1600, the CPU 1500, and/or the auxiliary storage 1700 comprises the aforementioned capacitor, semiconductor device, and/or electronic apparatus. For example, in at least one embodiment, the main memory 1600 may be a dynamic random access memory (DRAM) and may include the aforementioned capacitor, semiconductor device, and/or electronic apparatus. In some cases, the device architecture may be implemented in a form in which computing unit devices and memory unit devices are adjacent to each other in one chip without distinguishing sub-units.

The CPU 1500 and/or the main memory 1600 may be connected to at least one input/output device 2500. The input/output device (and/or devices) 2500 may include, for example, an input device (such as a microphone, touch pad, electronic mouse, keyboard, keypad, camera, etc.) and/or an output device (such as a speaker, display, haptic system, etc.).

A capacitor, according to at least one embodiment, may increase capacitance while reducing leakage current by providing a leakage current reducing layer in a dielectric film. The capacitor may be applied to semiconductor devices, such as DRAMs and electronic apparatuses, such as mobile devices, computers, notebooks, sensors, network devices, and neuromorphic devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:

a first electrode;

a second electrode spaced apart from the first electrode;

a dielectric film between the first electrode and the second electrode; and a leakage current reducing layer between the dielectric film and the second electrode, wherein the leakage current reducing layer includes an M-including oxide ($M_xAl_yO_z$), wherein x+y+z=1, 0<x<0.3, 0.16<y<0.4, 0.54<z<0.6, wherein the M-including oxide of the leakage current reducing layer has a greater energy band gap than $Al_2O_3$, and wherein the leakage current reducing layer is configured to increase a conduction band offset between the dielectric film and the second electrode.

2. The capacitor of claim 1, wherein M includes Mg or Si.

3. The capacitor of claim 1, wherein the leakage current reducing layer has a thickness of 30 Å or less.

4. The capacitor of claim 1, wherein a total thickness of the dielectric film and the leakage current reducing layer is 80 Å or less.

5. The capacitor of claim 1, wherein the dielectric film includes at least one of $ZrO_2$, $HfO_2$, $Al_2O_3$, SrO, and BaO.

6. The capacitor of claim 1, wherein the second electrode includes TiN doped with at least one of V, Nb, Ta, Cr, Mo, W, Pt, Ru, and Ir.

7. The capacitor of claim 1, wherein at least one of the first electrode and the second electrode includes at least one selected from the group consisting of W, TaN, TiN, RuOx, NbN, Sc, Al, Mo, MON, Pd, Pt, Sn, La, and Ru.

8. The capacitor of claim 1, wherein one of the first electrode and the second electrodes includes a semiconductor material.

9. A semiconductor device comprising:

a substrate;

a gate structure on the substrate;

a first source/drain region and a second source/drain region on the substrate; and a capacitor electrically connected to one of the first source/drain region or the second source/drain regions, wherein the capacitor includes a first electrode, a second electrode spaced apart from the first electrode, a dielectric film between the first electrode and the second electrode, and a leakage current reducing layer between the dielectric film and the second electrode, wherein the leakage current reducing layer includes an M-including oxide ($M_xAl_yO_z$), wherein x+y+z=1, 0<x<0.3, 0.16<y<0.4, 0.54<z<0.6, wherein the M-including oxide of the leakage current reducing layer has a greater energy band gap than $Al_2O_3$, and wherein the leakage current reducing layer is configured to increase a conduction band offset between the dielectric film and the second electrode.

10. The semiconductor device of claim 9, wherein M includes Mg or Si.

11. The semiconductor device of claim 9, wherein the leakage current reducing layer has a thickness of about 30 Å or less.

12. The semiconductor device of claim 9, wherein a total thickness of the dielectric film and the leakage current reducing layer is about 80 Å or less.

13. The semiconductor device of claim 9, wherein the dielectric film includes at least one of $ZrO_2$, $HfO_2$, $Al_2O_3$, SrO, and BaO.

14. The semiconductor device of claim 9, wherein the second electrode includes TiN doped with at least one of V, Nb, Ta, Cr, Mo, W, Pt, Ru, and Ir.

15. The semiconductor device of claim 9, wherein at least one of the first electrode or the second electrode includes at least one selected from the group consisting of W, TaN, TiN, RuOx, NbN, Sc, Al, Mo, MON, Pd, Pt, Sn, La, and Ru.

16. The semiconductor device of claim 9, wherein one of the first electrode and the second electrodes includes a semiconductor material.

17. An electronic apparatus comprising the semiconductor device according to claim 9.

* * * * *